United States Patent [19]

Perron et al.

[11] Patent Number: 5,021,782

[45] Date of Patent: Jun. 4, 1991

[54] VARIABLE LENGTH ENCODING METHOD AND VARIABLE LENGTH DECODING METHOD, ENCODING DEVICE AND DECORIDNG DEVICE FOR THE IMPLEMENTATION OF THIS METHOD

[75] Inventors: Claude Perron; Philippe Tourtier, both of Rennes, France

[73] Assignee: Thomson-CSF, Puteaux, France

[21] Appl. No.: 432,763

[22] PCT Filed: Feb. 17, 1989

[86] PCT No.: PCT/ER89/00061

§ 371 Date: Nov. 30, 1989

§ 102(e) Date: Nov. 30, 1989

[87] PCT Pub. No.: WO89/07863

PCT Pub. Date: Aug. 24, 1989

[30] Foreign Application Priority Data

Feb. 17, 1988 [FR] France ............... 88 01860

[51] Int. Cl.⁵ ............................................. H03M 7/40
[52] U.S. Cl. ......................................... 341/67; 341/79
[58] Field of Search .......................... 341/67, 79, 50

[56] References Cited

U.S. PATENT DOCUMENTS 3,918,047 11/1975 Denes .................... 341/67
4,188,669 2/1980 Rauscher ............ 341/67 X
4,553,130 11/1985 Kato ................... 341/67 X

OTHER PUBLICATIONS

IBM Technical Disclosure Bulletin, vol. 16, No. 2, Jul. 1973, (New York, U.S.), D. C. Van Voorhis: "Construction of Codes with Bounded Code-Word Lengths", pp. 487-488.

IBM Technical Disclosure Bulletin, vol. 24, No. 3, Aug. 1981, (New York, U.S.), I. Jones: "Variable Length Code-Work Encoder/Decoder", pp. 1514-1515.

Primary Examiner—William M. Shoop, Jr.
Assistant Examiner—Sharon D. Logan
Attorney, Agent, or Firm—Oblon, Spivak, McClelland, Maier & Neustadt

[57] ABSTRACT

A variable length encoding method for encoding a finite or infinite series of values corresponding to a random variable whose distribution monotonically decreases on either side of the mean value in which the encoding tree has a regular structure which is defined by an arithmetic and logic device. In order to encode each value E, a first binary word, including only bits having a same value and whose number of bits B is an increasing function of the value to the encoded E, is determined. The number of bits B is computed according to a predetermined arithmetic and logic function B(E). The method also involves determining a second binary word having a value to be encoded, in the set of values to be encoded arranged in order of decreasing probability, and whose number of bits B' is derived from the function B(E) and from the number of bits B in the first binary word. A code word is formed by combining the first and second binary words thus determined.

14 Claims, 6 Drawing Sheets a=1, b=1, c=1

```
FIELD    1  1  1  1  0  0  1  1  1  0  1  1  0  1  0  0  1 ...
n°i      ⎿n°1⎿ 2 ⎿  3  ⎿    4    ⎿      5      ⎿
n(i)     1    2    3        4            5
CH(i)    1    3    4
``` a=1, b=2, c=1

```
FIELD    1  1  1  1  0  0  1  1  1  0  1  1  0  1  0  0  1 ...
n°i      ⎿n°1⎿ 2 ⎿ 3 ⎿ 4 ⎿   5   ⎿   6   ⎿   7   ⎿
n(i)     1    1   2   2    3       3       4
CH(i)    1    1   3   0
``` a=1, b=1, c=2

```
FIELD    1  1  1  1  0  0  1  1  1  0  1  1  0  1  0  0  1 ...
n°i      ⎿n°1⎿   2   ⎿     3     ⎿         4         ⎿
n(i)     1       3         4                 6
CH(i)    1       7         7
```

VARIABLE LENGTH ENCODING METHOD AND VARIABLE LENGTH DECODING METHOD, ENCODING DEVICE AND DECORIDNG DEVICE FOR THE IMPLEMENTATION OF THIS METHOD

The invention relates to a variable length encoding method and a variable length decoding method, and to an encoding device and a decoding device for the implementation of this method.

A digitized signal is constituted from samples which can assume a finite number of values. These values are events each having a certain probability which is in general different for each value. It is known to encode events having unequal probabilities by means of predetermined code words having variable length, by representing the statistically most frequent events with short code words and by representing the least frequent events with longer code words. This type of encoding is known as entropic encoding. The code words are binary words which are transmitted in serial from without discontinuities. In order to be able to decode these code words, it is necessary to be able to distinguish them from each other despite their variable length.

The correspondence between the code words and the events can be represented graphically by a diagram called an encoding tree. This encoding tree comprises a root and branching branches constituted of segments. Each segment is associated with a binary 0 or binary 1 value. The encoding tree enables a binary word to be associated with an event as a function of its probability by following the tree from its root to the end of a branch, this end being associated with an event. The code word corresponding to an event is constituted by a series of bits associated with the different segments which are passed through in order to move from the root to the end of the branch in question.

Conversely, an event can be recovered by means of the same tree, by starting from the root and following a first segment corresponding to the value of the first bit of the code word, then a second segment corresponding to the value of the second bit of the code word etc. . . . , until arrival at the end of a branch, this end corresponding to an event which is the event to be decoded.

It is known to embody an encoding device and a decoding device implementing this type of variable length code by means of a read only memory for the encoding and a read only memory for the decoding. The encoding memory contains code words at addresses constituted by the values to be encoded. The decoding memory contains the events at addresses constituted by the code words.

An application of Huffmann encoding consists, for example, in encoding coefficients resulting from the encoding of a picture by the cosine transformation. The coefficients have values represented in 12 bits, for example. The encoding read only memory therefore comprises a 12-bit address input and a 16-bit data output, if the code has a maximum length fixed at 16 bits, giving a capacity of 4 kilowords (16-bit words). The decoding read only memory therefore comprises a 16-bit address input and a 12-bit data output, giving a capacity of 64 kilowords (12-bit words). the capacity of the necessary read only memories is therefore relatively large and results in a high production cost. Furthermore, the dynamic range of the values to be encoded is limited by this capacity.

The choice of code words consists in carrying out a statistical study of the values of the transformation coefficients of a typical series of pictures; then in determining the optimum code words by applying an algorithm which is described in particular in the French patent application No. 2,600,226 filed by the Applicant.

This algorithm enables an optimum Huffmann code to be obtained for events having well-determined statistical characteristics, but there is a large number of other encoding trees enabling a same series of events to be encoded with an non-optimum cost.

The device used for carrying out such an optimized Huffmann encoding is a read only memory since there is no simple mathematical relationship between the binary words representing the events at the input of the encoding device and the binary code words at the output of the encoding device. For the same reason, the decoding device is constituted from a read only memory. This type of device has the disadvantage of generally requiring a memory of large capacity.

A Huffmann encoding tree can be optimized only for a well-determined statistical distribution. If the probabilities of the events vary in time, it is possible to envisage the use of a set of separate encoding trees, providing a set of read only memories in the encoding device and a set of read only memories in the decoding device. This solution however has the disadvantage of multiplying the capacity of the read only memories used. This solution is therefore costly in hardware.

The object of the invention is to propose an encoding method and a decoding method not requiring the use of read only memories, while enabling a change of encoding tree according to changes in the statistical distribution of the events. The subject of the invention is an encoding method and a decoding method in which the Huffmann code words and the events are related by a simple arithmetic and logic law whose parameters can be modified easily when the statistical characteristics of the events change. The encoding device and the decoding device are essentially constituted by an arithmetic and logic device, simple to embody, inexpensive, and which does not limit the dynamic range of the variable to be encoded.

According to the invention, a variable length encoding method for encoding a series of consecutive, positive or zero, integer values whose probability of occurrence decreases as a function of the value, is characterized in that, in order to encode each value E, it consists in:

determining a first binary word including only bits having a same value, and whose number of bits B is an increasing function of the value to be encoded E, computing the number B according to a predetermined function B(E);

determining a second binary word having a value corresponding to the rank of the value to be encoded, in the set of values to be encoded arranged in order of decreasing probability, and whose number of bits is derived from the function B(E) and from the number of bits in the first binary word;

constituting a code word by combining the first and second binary words thus determined.

Two variants of the method according to the invention make possible the encoding also of a finite series of relative and consecutive integer values.

The invention will be better understood and other details will appear with the help of the following description and of the accompanying drawings in which.

The method according to the invention can be implemented for encoding all kinds of events, provided that the probability distribution is monotonically decreasing on either side of the mean of the random variable to be encoded. In this case, the events can easily be represented by a series of consecutive, positive or zero, integer values. Initially, the description below will disregard the values to be encoded by considering them as a finite series of events in which each event to be encoded is represented by a number which increases as the probability of the event decreases. The most probably event is called event No 0, the others being called: event No 1, No 2, etc. .... In the particular case in which the values to be encoded are all positive or zero, there is identity between the number of the event to be encoded and the value which constitutes the event to be encoded. For example, if the values to be encoded are the integer values 0, 1, 2, ..., 127; since these values have decreasing probabilities, the encoding method is applied directly to the series of binary values: 0, 1, 2, ..., 127.

The features of the method according to the invention appear on considering the encoding trees obtained by this method. Each of these encoding trees comprises N levels, each $i^{th}$ level for $i=1$ to $N-1$ comprising a number of branch ends, i.e. a number of events determined by an arithmetic law, as a function of i. The $N^{th}$ and last level comprises a number of events less than or equal to that determined by this law.

Figure 1:
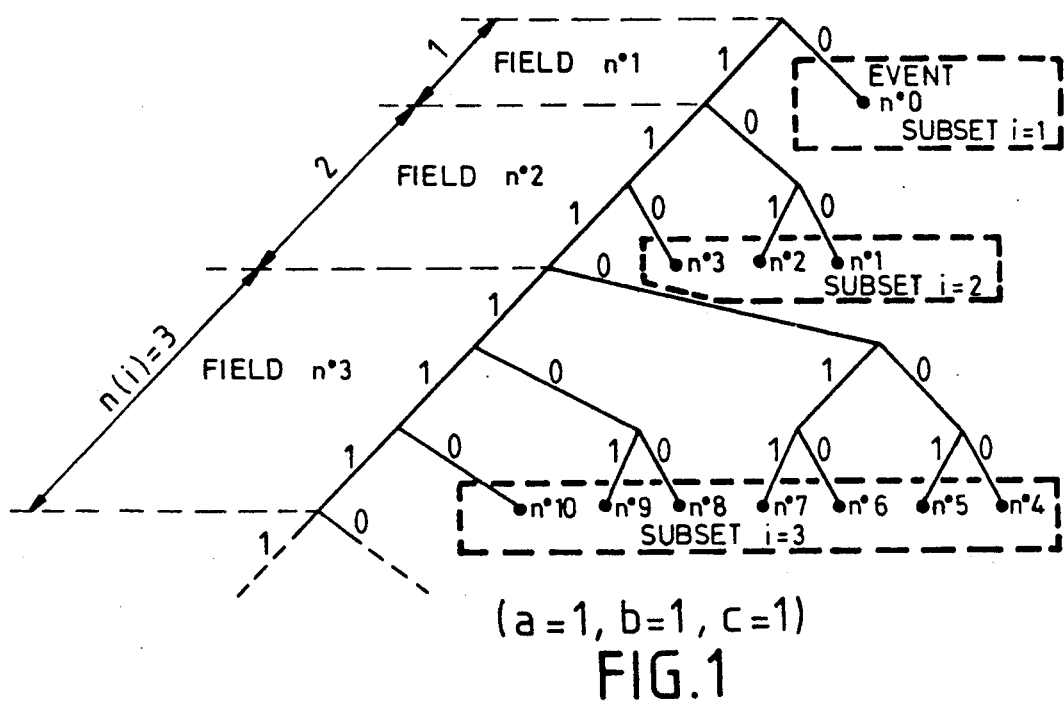
FIGS. 1 to 3 show three examples of Huffmann encoding trees used for the implementation of the method according to the invention.

FIG. 1 shows an example of an encoding tree, in which the root of the tree is situated at the top of the figure, and the segments corresponding to the value 1 are oriented towards the left while the segments corresponding to the value 0 are oriented towards the right. This tree therefore comprises a branch constituted solely of segments corresponding to the value 1, this branch being the one furthest to the left in this figure. Between two consecutive segments on this branch, there is a bifurcation to which is connected a segment corresponding to the value 0. This segment can have a free end which then corresponds to an event which is represented by a black spot and by its number; or alternatively this segment is terminated by a bifurcation to a segment corresponding to the value 1 and a segment corresponding to the value 0. In this FIG. 1, the first case corresponds to the event No 3 and the second case corresponds to the events Nos. 1 and 2 for example.

In order to construct a tree having a regular structure which is easy to define by a simple law of progression, all possible events are divided into a series of N disconnected sub-sets each comprising a number of events determined by a simple law. In this example, a first sub-set comprises only the event No 0; a second sub-set comprises the events No 4 to No 10; etc..... Each of these sub-sets comprises $2^{n(i)}-1$ events, n(i) being an integer which is a function of the rank i of the sub-set of events, by a predetermined law of progression. It should be noted that the number of bits necessary to constitute each of the code words representing the events of the sub-set of events of rank $i_o$ in the encoding tree is equal to the sum of all the numbers n(i) for $i=1$ to $i_o$.

Figure 2:
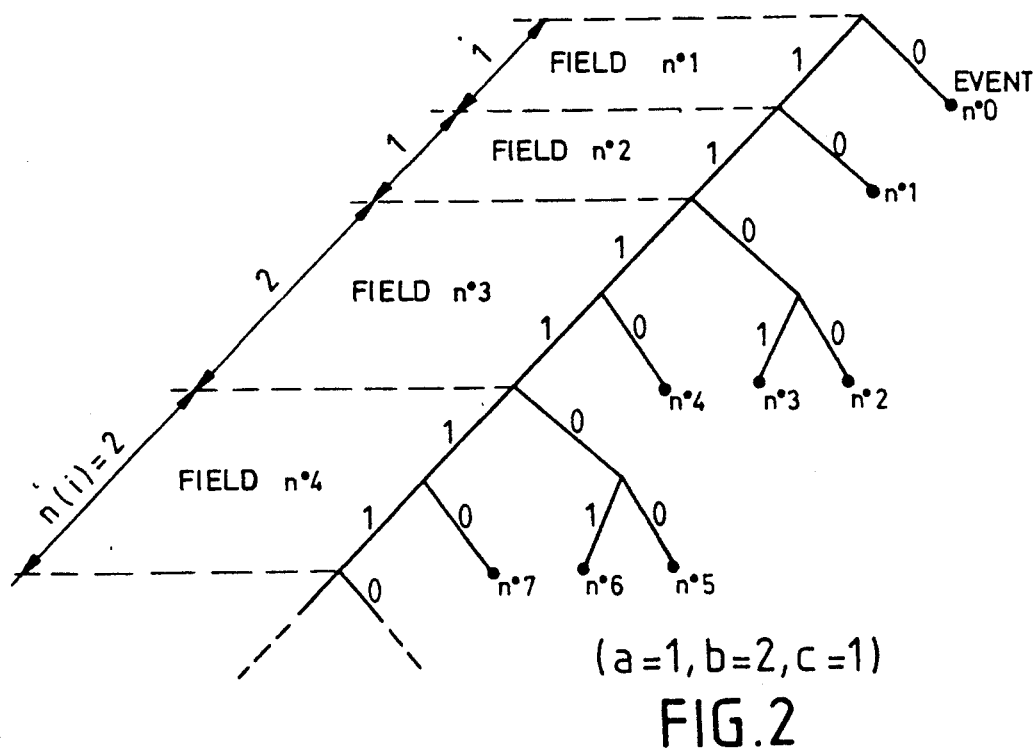

In FIG. 2, a sub-set of rank $i=1$ comprises the event No 0 which is encoded by one bit taking the value 0; a sub-set of rank $i=2$ comprises the events No 1 to No 3, encoded by three bits respectively taking the values 100, 101, 110; a sub-set of rank $i=3$ comprises the events No 4 to No 10 which are encoded by six bits taking the values: 111000, ..., 111110; etc. As shown in this figure, each event of an $i_o$th sub-set is represented by a code word having 6 bits and which is constituted by a first section, having 3 bits, common to all of the events of the same sub-set, and a second section having three bits whose value corresponds to the rank of an event within the sub-set in question, using the convention that the first event has a rank of value 0. For example, all of the events No 4 to No 10 of the third sub-set are encoded by a code word comprising as a first section: 111. The event No 4 is represented by a code word whose second section is 000. The event No 5 is represented by a code word whose second section is 001. The event No 6 is represented by a code word whose second section is 010.

As a general rule, the first section of the code words of the sub-set of rank $i_o$ is formed of B bits all having the value 1 and of which the number B is equal to the sum of all of the numbers n(i) for $i=1$ to $i_o-1$. In the special case of the first sub-set, $i_o=1$, the first section does not contain any bits.

As a general rule, the value of the second section of the code word varies from 0 to $2^{n(i_o)}-2$. For example, for the third sub-set, in FIG. 1, the value of the second section varies from 000 to 110.

The fact of having divided the set of events into a series of disconnected sub-sets, each $i^{th}$ sub-set comprising $2^{n(i)}-1$ events, enables all of the possible values of the second section of the code word to be used. Naturally, if the set of events includes a number of events which is not equal to a power of 2, the last sub-set, the $N^{th}$ sub-set, can comprise a number of events which is less than the maximum value of the second section of the code word corresponding to this sub-set.

The law of progression of n(i) as a function of i can be any law, but the encoding and decoding will be much simpler to implement, by means of a simple arithmetic and logic device, if this law can be expressed in a simple way be arithmetic and logical operations. The preferred laws of progression are linear laws, with an initial value a, and a slope equal to a number c of events for a step equal to b sub-sets. In other words, n(i) is given by the following formulae:

$n(1)=a$ $n(i)=n(i-1)$ if $i-1$ is within the range between 1(modulo b) and $b-1$(modulo b) inclusive;

and $n(i)=n(i-1)+c$ if $i-1=0$(modulo b);

a, b and c being fixed integer constants. In the example of FIG. 1: $a=1$, $b=1$ and $c=1$.

A law of progression n(i) having been determined, the encoding tree is defined. In order to encode a value E, belonging to a series of consecutive integer values: 0, 1, 2, ..., M, the method according to the invention consists in:

determining the first section of the code word by computing its number of bits B as a function of E. This number of bits can have only one of the values of the series:

$n(1)$
$n(1)+n(2)$
$n(1)+n(2)+n(3)$
$n(1)+n(2)+n(4)$
etc. . . . .

The determining of B, for a given value of E, consists in determining the rank $i_o$ of the sub-set in which the event constituted by the value E is placed.

Each $i_o$th sub-set comprises the events constituted by the values strictly greater than the sum of $2^{n(i)}-1$ for $i=1$ to $i_o-1$ and less than or equal to the sum of $2^{n(i)}-1$ for $i=1$ to $i_o$. The method than consists in determining $i_o$ by comparing E with the sum of $(2^{n(i)}-1)$ for increasing i, until this sum becomes greater than E. Then B is derived, which is equal to the sum of $n(i)$ for $i=1$ to $i_o-1$;

determining the second section of the code word by computing the rank of the value E in the $i_o$th sub-set. If the first event of the $i_o$th sub-set is assumed to have the rank 0, then the rank of the value E in this sub-set is equal to E less the total number of all of the events placed in the sub-sets of rank $i=1$ to $i=i_o-1$. It should be noted that the second section of the code word comprises not only significant bits necessary for expressing this rank, but also comprises insignificant bits of zero value, the number of these bits being such that the total number B' of bits in the second section of the code word is equal to $n(i_o)$. For example, in FIG. 1, the event No 7 has a rank equal to 4, counting from 0, in the 3rd sub-set of events, and therefore B'=n (3)=3 bits and the value of the second section of the code word is equal to 4, this second section therefore being constituted by 011.

FIG. 2 shows another encoding tree corresponding to a law of progression n(i) having the parameters: a=1, b=2 and c=1. In this tree, the first two sub-sets comprise only a single event: No 0 and No 1 respectively. The next two sub-sets each comprise three events. The next two sub-sets, which are not shown, each comprise four events. This law of progression results in the event of the sub-set of rank $i=1$ being represented by a code word having $n(1)=1$ bit; the event of the sub-set of rank $i=2$ is represented by a code word having $n(1)+n(2)=2$ bits; the events of the sub-set of rank $i=3$ is represented by a code word having $n(1)+n(2)+n(3)=4$ bits; the sub-set of rank $i=4$ is represented by a code word having $n(4)+n(3)+n(2)+n(1)=6$ bits; etc. . . . .

Figure 3:
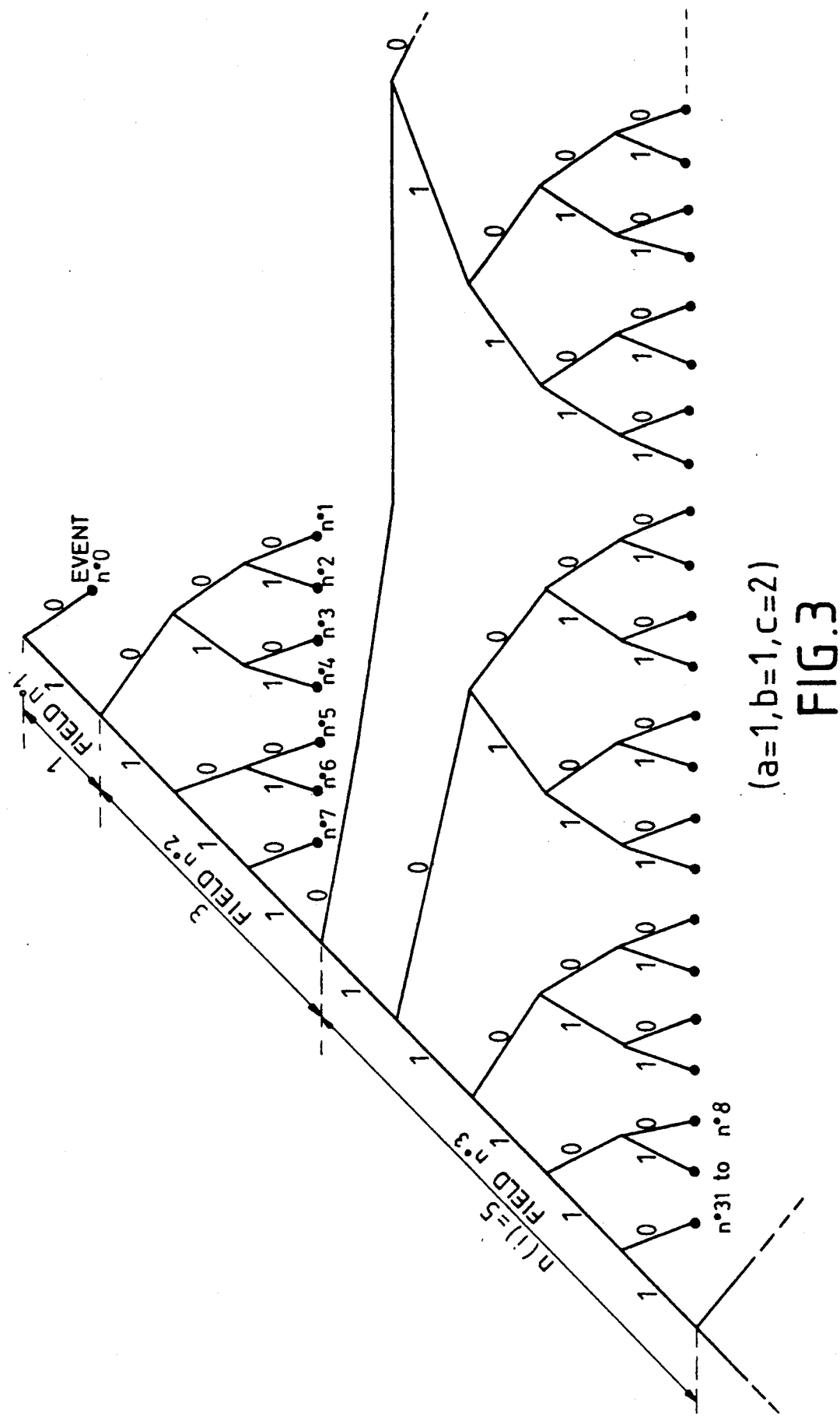

FIG. 3 shows a third example of an encoding tree, corresponding to a law of progression having the parameters $a=1$, $b=1$ and $c=2$. It comprises a first sub-set having a single event, No 0; a second sub-set having seven events, No 1 to No 7; a third sub-set having 24 events No 8 to No 31; etc. . . . .

As a general rule the value a is preferably chosen between 1 and 5 inclusive, the value b is preferably chosen between 1 and 3 inclusive and the value c is preferably chosen between 0 and 3 inclusive. The various laws of progression thus obtained do not provide optimum encoding trees, but it is possible to select from them the tree which gives the minimum encoding costs for a given application.

A refinement of the encoding method according to the invention relates to applications such as picture encoding, where the statistical distribution of the events can vary greatly in time. It consists in defining, for a same number of events, several sets of code words, providing a particularly low encoding cost for the different statistical distributions of the events respectively. The selection of the best encoding tree at a give time is carried out by computing the cost of encoding a certain number of events, over a certain duration, by applying the various encoding trees in parallel, and then by determining which one provides the lowers encoding cost.

Naturally, it is necessary in this case to transmit information accompanying the encoded data in order to indicate which of the predetermined encoding trees has been used. This additional information can be constituted for example from the binary value, in clear, of the parameters a, b and c.

The decoding is performed according to a decoding tree which is identical to the encoding tree. For example, assume that the following series of bits has to be decoded, having been encoded by the encoding tree shown in FIG. 1:

11110011101101001

In order to decode the first event represented by this series of encoded data, it suffices to follow, in the tree of FIG. 1, the segments respectively associated with the values 1,1,1,0,0, etc, starting from the root. This path ends in the event No 8. The first code word is therefore 11100 and represents the event No 8. In order to decode the next code word, it is necessary to follow the tree again, starting from the root, for the binary values 11101, etc.

The decoding consists of two steps: a first step binary values 11101, etc.

The decoding consists in two steps: a first step consists in locating in which sub-set the event to be decoded occurs; a second step consists in finding the rank of the event to be decoded from among all of the events in this sub-set.

In the example considered in FIG. 1, the law of progression: $a=1$, $b=1$, $c=1$, enables the decoding device to know that $n(1)=1$ and that the events of the sub-set of rank $i=1$ are therefore encoded by a single bit, and therefore that there is only one event in this sub-set. This law of progression also enables the decoding device to know that: the events of the sub-set of rank $i=2$ are represented by a code word having $n(1)+n(2)=2$ bits, comprising a first section of $n(1)=1$ bit of value always equal to 1, and a second section comprising $n(2)=1$ bit which can have different values; that the events of the sub-set of rank $i=3$ are encoded by $n(1)+n(2)+n(3)=6$ bits, comprising a first section of $n(1)+n(2)=3$ bits of value always equal to 111 and a second section comprising $n(3)=3$ bits which can have different values; etc. . . . .

The decoding therefore consists firstly in detecting if the first group of bits in the series of encoded data is: 1, or 111, or 111111; etc. . . . , by dividing off, in the series of encoded data, a series of separate fields respectively having n(1) bits, n(2) bits, n(3) bits, etc. . . . , and testing the value of the bits in these fields for increasing i until a field is found which contains at least one bit of value 0. For this purpose, an example of implementation of the method consists in computing a series of integers $n(1), \ldots, n(i)$, for integer i starting from 1 and increasing, according to the predetermined law of progression; determining the value CH(i) of a field constituted from $n(1) + n(2) + \ldots + n(i)$ consecutive bits of the series of encoded data; then in comparing the value CH(i) with the value $2^{n(i)} - 1$; and in determining a value $i_o$ of i such that $CH(i_o)$ is included between $2^{n(i_o - 1)} - 1$ and $2^{n(i_o)} - 1$. This is equivalent to seeking the first bifurcation which must be made towards the right, on the tree shown in FIG. 1, when this tree is passed through from the root to the event to be decoded.

Figures 4, 5, 6, 7:
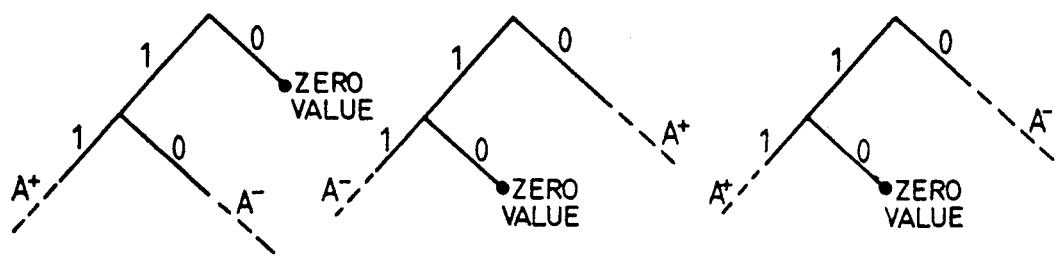
FIGS. 4 to 6 illustrate the decoding method according to the invention, for these three examples of encoding trees.
FIG. 7 shows encoding trees corresponding to relative integer values.

FIG. 4 shows the fields No i, for i=1 to 5, which are successively divided off in the series of binary data 11110011101101001, having been encoded according to the tree in FIG. 1. The law of progression n(i) is the same as that used for the encoding. The number of bits in these fields is computed according to the following formulae:

$n(1) = a$ $n(i) = n(i-1)$ if $i-1$ is between 1(modulo)b and $b-1$(modulo b) inclusive;

$n(i) = n(i-1) + c$ if $i-1 = 0$(modulo b)

a, b and c being the same parameters as those used for the encoding. In this example $a=1$, $b=1$ and $c=1$. The field No 1, No 2, No 3, No 4 and No 5 therefore have the following numbers of bits respectively: 1,2,3, 4,5. The field No 1 and the field No 2 are each constituted by a binary word having a value of the form $2^{n(i)} - 1$, the values 1 and 11 respectively. On the other hand, the field No 3 is constituted from three bits having the binary value 100 which is not equal to $2^{n(3)} - 1 = 111$, since it comprises two bits equal to 0. In this example, $i_o$ is therefore equal to 3 and $n(i_o)$ is equal to 3; the first section of the code word is therefore constituted by 111 and the second section of this code word is constituted by the bits of the field No 3, i.e. 100.

The binary value of this second section corresponds to the rank of the event to be decoded, within its sub-set of events. The field No 3 having a value equal to 4, the rank of the event is therefore the fifth rank within the third sub-set, taking account of the fact that the first event of a sub-set corresponds to the value 0 for the second section of the code word. In order to know its number within the set of events to be decoded, it suffices to add the value 4 to the total number of events contained in the first and second sub-sets. As has been stated previously, each sub-set of rank i in the encoding tree, possibly with the exception of the last sub-set, comprises $2^{n(i)} - 1$ events. Consequently, the number of the event to be decoded is equal to the sum of the value 4 plus the number of events in the sub-set No 2, which is equal to 3, plus the number of events in the sub-set No 1, which is equal to 1. This gives a total of 8, which obviously denotes the event No 8.

It should be noted that, in order to add the numbers of events $2^{n(i)} - 1$ for i=1 to $i_o - 1$, it suffices to add the values CH(i) for i=1 to $i_o - 1$, since CH(i) is the value of a field of n(i) bits of value 1. As it is necessary to also add the value of $CH(i_o)$ of the field of rank $i_o$ where the first bit of value 0 has been detected, it suffices to add all of the values CH(i) for i=1 to $i_o$, in order to obtain the number of the event to be decoded.

FIG. 5 illustrates the decoding of the same series of binary data in the case in which it results from an encoding by means of the encoding tree shown in FIG. 2. The series of values n(i) corresponding to the law of progression having the parameters $a=1$, $b=2$, $c=1$, is: 1,1,2,2,3,3,4,4, etc..... The fields No 1, No 2, No 3 are therefore constituted respectively by: 1 bit, 1 bit and 2 bits of the encoded data. These fields contain only 1's, i.e. they correspond to values of the form $2^{n(i)} - 1$. The field No 4, on the other hand, comprises two 0's and, consequently, the first section of the code word is constituted by 1111.

It is possible to also conclude that $i_o$ is equal to 4 and $n(i_o)$ is equal to 2. The second section of the code word is constituted by the two bits of the field No 4; i.e. 00. The event to be decoded is therefore the first event in the sub-set No 4. The number of events in the sub-set No 1 being equal to 1, the number of events in the sub-set No 2 being equal to 2, and the number of events in the sub-set No 3 being equal to 3, the rank of the event to be decoded is therefore the rank No 5 in the set of events, this set being numbered starting from No 0.

FIG. 6 illustrates the decoding of the same series of binary data in the case in which it results from an encoding according to the encoding tree shown in FIG. 3, the parameters of the law of progression being $a=1$, $b=1$ and $c=2$. The number n(i) of bits in each field considered successively is equal to: 1,3,4,6 etc..... The value CH(i) of the field No 1 and of the field No 2 is equal to 1 and to 7 respectively, i.e. it is of the form $2^{n(i)} - 1$. The field No 3 is not of this form and has the binary value 00111, i.e. a decimal value equal to 7. The event to be decoded is therefore the eighth in the third sub-set of events and its number is equal to 15 in the set of possible events.

Two variant implementations of the method according to the invention enable the encoding and decoding to be made of consecutive, relative, integer values, whose probability of occurrence decreases as a function of their absolute value. They enable the encoding to be made of a random variable x which is not centered on its mean value m, by encoding the deviation from the mean: $x - m$. In a first case, the positive values and the negative values are assumed to have the same probability, for a given absolute value. For example the positive integers 1, 2, 3, . . . , 63 are assumed to have the same probabilities as the negative integer values $-1, -2, \ldots, -63$; and their probabilities are assumed to be less than that of the zero value and decreasing in that order. The encoding of these values consists in previously making an event number correspond to them according to the following table:

| value | event |
|---|---|
| 0 | No 0 |
| 1 | 1 |
| −1 | 2 |
| 2 | 3 |
| −2 | 4 |
| . | . |
| . | . |
| . | . |
| 63 | 126 |
| −63 | 127 |

The placing of the values: $-63, \ldots, 0, \ldots 63$ into correspondence with the event numbers: 0 to 127, is performed very simply, without necessitating a code conversion table stored in memory. In fact it suffices to represent each relative value by a sign bit and by absolute value bits and then to place the sign bit to the right of the least significant bit.

For example the value $-2$ is represented by a sign bit having the value 1 (the $-$ sign) and two bits of value 10 (absolute value). It becomes 101, i.e. 8.

The encoding is then carried out as described previously in the case of a series of positive integer values 0, 1, ..., 127 having decreasing probabilities.

In a second case, the negative values are assumed to have probabilities which are not identical to those of the positive values, for a same absolute value. The method then consists in using an encoding tree having three sub-trees respectively corresponding to the positive values, the negative values and the zero value. The zero value corresponds to a very short sub-tree constituted by one such segment or by two segments.

In general, the probability of the positive values or negative values decreases monotonically as a function of the absolute value, which enables the easy establishment of a correspondence between the values to be encoded and the event numbers which are used in the encoding sub-trees. For example, assume the relative integer values to be encoded: $-63, \ldots, 0, \ldots, +63$. A first sub-tree $A^-$, defined by a first set of parameters (a, b, c) is established for the events No 0 to No 62 with the following correspondences:

| value | event |
|-------|-------|
| $-1$  | No 0  |
| $-2$  |       |
| .     |       |
| .     |       |
| $-63$ | No 62 |

The encoding according to this tree is carried out as described previously for positive integers, but there is a systematic shift by unity between the absolute value and the event number. This shift can be produced simply by means of an adder. A second sub-tree, $A^-$, defined by a second set of parameters (a, b, c) is established for the events numbered No 0' to No 62' with the following correspondences:

| value | event  |
|-------|--------|
| $+1$  | No 0'  |
| $+2$  |        |
| .     |        |
| .     |        |
| $+63$ | No 62' |

The encoding according to this tree is carried out as described previously for positive integers, but there is a systematic shift by unity between the value and the event number. This shift can be produced simply by means of an adder.

Finally, each relative integer value is encoded by a code word comprising a prefix of two bits followed by a code word of variable length. The prefix enables the selection to be made either of the zero value, or of the first sub-tree $A^-$ or of the second sub-tree $A^+$. The value of the 2 bits of the prefix is chosen as a function of the probabilities of occurrence of a zero value, of a positive value and of a negative value respectively. FIG. 7 shows the resultant tree in the three possible cases.

The decoding according to such a tree consists first of all in reading the prefix, which is constituted by the first two bits of encoded data, in order to know if these encoded data represent a zero value, a positive value or a negative value. In the first case, the conclusion is fast. In the second and third cases, it is necessary to apply the previously described decoding method, using the first or second set of parameters respectively; then it is necessary to add unity to the event number found, in order to recover the exact absolute value, and, finally, it is necessary to attach to this absolute value a sign bit derived from the value of the prefix.

Figure 8:
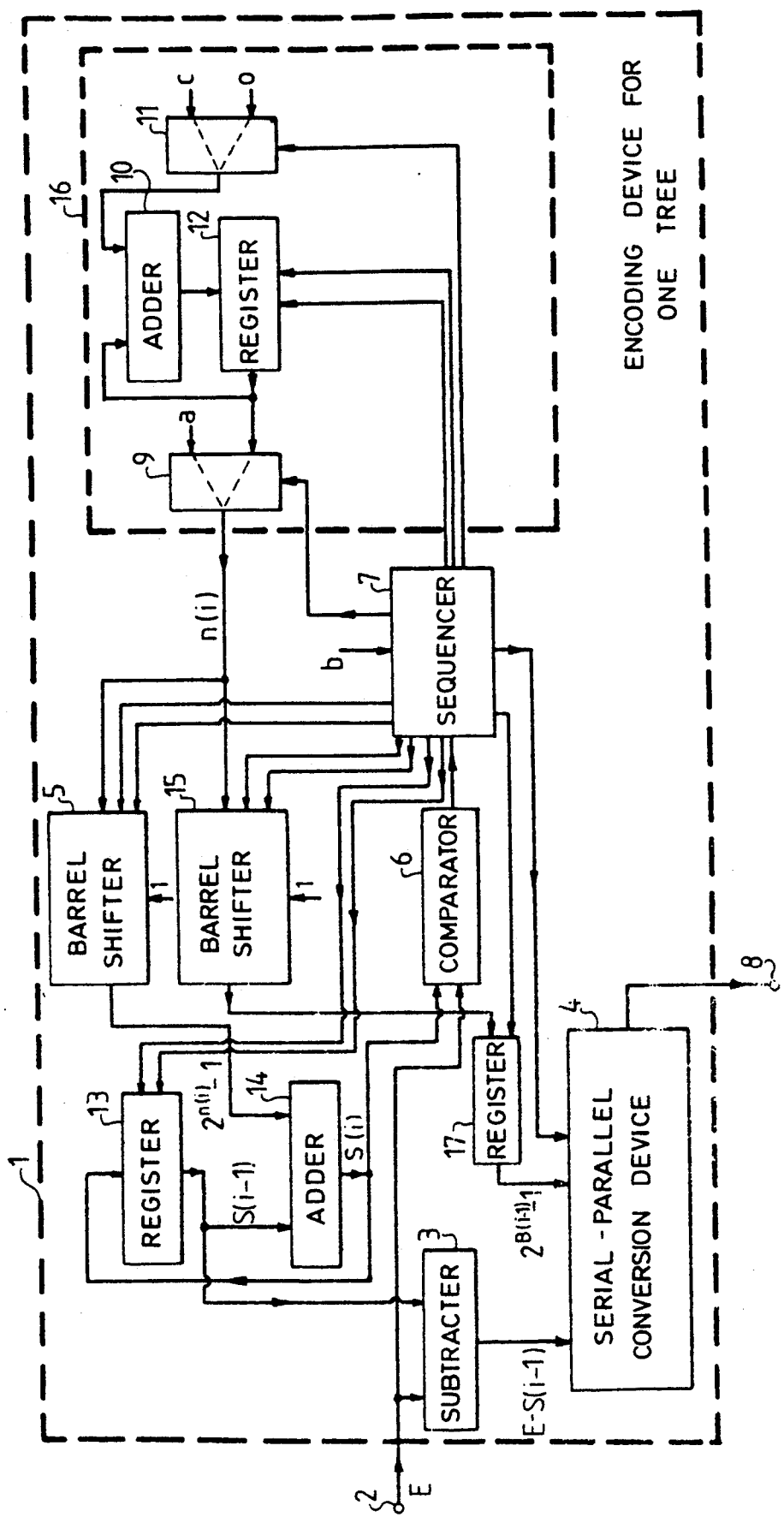
FIG. 8 shows the block diagram of an embodiment of the encoding device according to the invention, for a single encoding trees.

FIG. 8 is the block diagram of an embodiment of an encoding device 1 for the implementation of the method according to the invention when a single encoding tree is used. This example comprises: an input connection 2, receiving a series of binary words representing positive integer values to be encoded; a subtracter 3, a serial-parallel converter device 4; two barrel shifters 5 and 15; a comparator 6; a sequencer 7; an output connection 8 supplying a series of code words in serial form; two registers 13 and 17; an adder 14; and means of computing 16 for computing a series of integer values n(i) according to a determined law of progression.

These means 16 comprise: two multiplexers each having two inputs and one output, 9 and 11; an adder 10; and a register 12. The means 16 compute a series of values n(i) for i increasing from 1, according to a predetermined law of progression defined by constants, a, b, c. The rate of computing this series is fixed by the sequencer 7 which controls the multiplexers 9 and 11 and which controls the register 12. It also controls the shifters 5 and 15, the registers 13 and 17, and the device 4.

The multiplexer 11 receives the value 0 on a first input and receives the value c on a second input. An output of the multiplexer 11 is connected to a first input of the adder 10 which receives on a second input a value supplied by an output of the register 12. The output of the adder 10 is connected to the input of the register 12. A first input of the multiplexer 9 is connected to an output of the register 12. A second input of the multiplexer 9 receives the constant value a. An output of the multiplexer 9 constitutes the output of the means of computing 16 and supplies a series of values n(i) to a control input of the shifter 5. A clock input and a zero reset input of the register 12 are respectively connected to two outputs of the sequencer 7. A first input of the sequencer 7 receives the value of the constant b. A second input of the sequencer 7 is connected to an output of the comparator 6.

At the start of the encoding of each event, the sequencer 7 commands a zero reset of the register 12. The adder 10 and the register 12 constitute an accumulator for computing each value n(i). In order to compute the first value, n(i), the sequencer 7 controls the multiplexer 9 in such a way that it transmits the value a to the output of the means 16. For the values n(i) with i between 2(modulo b) and b(modulo b) inclusive, the sequencer 7 controls the multiplexer 9 in such a way that it transmits the value supplied by the output of the register 12 and it controls the multiplexer in 11 in such a way that it transmits the value 0 to the adder 10. The value n(i) therefore remains constant for a series of b values of i. When i, which is counted by a counter inside the sequencer 7, is equal to (b+1)modulo b, the sequencer 7 controls the multiplexer 11 such that it transmits the value c to the input of the adder 10. For each value n(i), whatever i maybe, the sequencer 7 controls the clock input of the register 12 in order to store a value n(i).

In this embodiment the code words have a maximum length of 16 bits. The shifter 5 has: a first control input connected to the output of the means of computation 16; a data input continuously receiving a value 1; and an output connected to a first input of the adder 14. The shifter 5 furthermore has two control inputs connected to two outputs of the sequencer 7 in order to command a zero reset of the shifter 5 for each new value of n(i), and then to command the parallel output of n(i) low significance bits having the value 1 and of $16-n(i)$ high significance bits having the value 0.

The shifter 15 has a first control input connected to the output of the means of computation 16; a data input continuously receiving the value 1; and an output connected to an input of the register 17. The shifter 15 furthermore has two control inputs connected to two outputs of the sequencer 7 in order to command a zero reset of the shifter 15 at the start of the coding of each value to be encoded, and then in order to command the parallel output of $B(i-1)$ low significance bits having the value 1 and of $16-B(i-1)$ high significance bits having the value 0, $B(i-1)$ being the sum $n(1)+n(2)+\ldots+n(i-1)$. For each new value $n(1), n(2), \ldots, n(i-1)$, the sequencer 7 supplies clock pulses and a validation signal to the shifter 15 in order that its output may respectively supply $n(1), n(2), \ldots, n(i-1)$ additional bits having the value 1.

A control input of the register 17 is connected to an output of the sequencer 7. An output of the register 17 is connected to an input of the device 4.

A second input of the adder 14 is connected to an output of the register 13. An output of the adder 14 is connected to an input of the register 13 and to a first input of the comparator 6. The output of the register 13 is furthermore connected to a first input of the subtracter 3. A second input of the subtracter 3 is connected to the input connection 2. An output of the subtracter 3 is connected to a second input of the device 4. A control input and an output of the device 4 are respectively connected to an output of the sequencer 7 and to the output connection 8 of the encoding device 1. A clock input and a zero reset input of the register 13 are respectively connected to two outputs of the sequencer 7. A second input of the comparator 6 is connected to the input connection 2. The output of the comparator 6 is connected to an input of the sequencer 7.

A series of positive or zero integer values in applied to the input connection 2 in the form ob 8-bit binary words, in order to be encoded. The probability of occurrence of each value is assumed to decrease as the value increases. At the instant in question, a value E is applied to the input connection 2. The sequencer 7 then commands a zero reset of the register 13, then commands the computing of a value $n(1)$ by the means of computation 16. The shifter 5 supplies a value $2^{n(1)}-1$ to the adder 14. The output of the register 13 supplies a zero value. Therefore the output of the adder 14 supplies a value $S(1) = 2^{n(1)}-1$, then the latter is stored in the register 13. The output of the register 13 supplies a value $S(1)$ which is then equal to $2^{n(1)}-1$. The comparator 6 compares the values $S(1)$ and E. if $S(1)$ is less than or equal to E, the comparator 6 supplies a logic signal to the sequencer 7 such that it increments i by unity and commands the computation of a new value $n(i)$.

The sequencer 7 commands the means of computation 16 to supply a series of values $n(i)$ which are increasing according to the law of progression determined by the set of parameters a, b and c; until the comparator 6 detects that the value $S(i)$ supplied by the adder 14 is greater than the value E to be encoded. The sequencer 7 then stops incrementing i. The sequencer 7 commands the storage in the register 13 of the value $S(i)$ supplied by the adder 14, each time that the value i has been incremented, unless the comparator 6 detects that E is less than the value supplied by the adder 14. In this case, the value i has reached $i_o$; the adder 14 supplies $S(i_o)$ but the register 14 contains $S(i_o-1)$; and it is this latter value which is used by the subtracter 3 in order to compute the first part of the code word which represents the value E.

When the incrementation of i is stopped at $i_o$, the shifter 5 supplies a binary word having $B(i_o)$ bits of low significance having the value 1, in other words this word has the value $2^{B(i_o)}-1$. The register 17 contains the binary word having been previously determined by the shifter 15, i.e., having the value $2^{B(i_o-1)}-1$. In fact, the sequencer 7 controls the writing, into the register 17, of the binary word supplied by the shifter 15 for each new value of $n(i)$ until i has reached the value $i_o$. The last value stored in the register 17 is therefore $2^{B(i_o-1)}-1$.

The device 4 therefore constitutes the code word representing the event to be encoded, this code word comprising a first section constituted by the bits of value 1 of the binary word supplied by the register 17, and a second section constituted by the binary value of the difference between E and $S(i_o-1)$, computed by the subtracter 3. The device 4 supplies the code word in serial form to the output connection 8.

The sequencer 7 re-initializes the entire encoder in order that it may then process the next event. For this purpose, it zero resets the registers 12 and 13, and resets the multiplexer 9 into the state in which it transmits the value a; and it zero resets its internal counter which counts the value of i.

Figure 9:
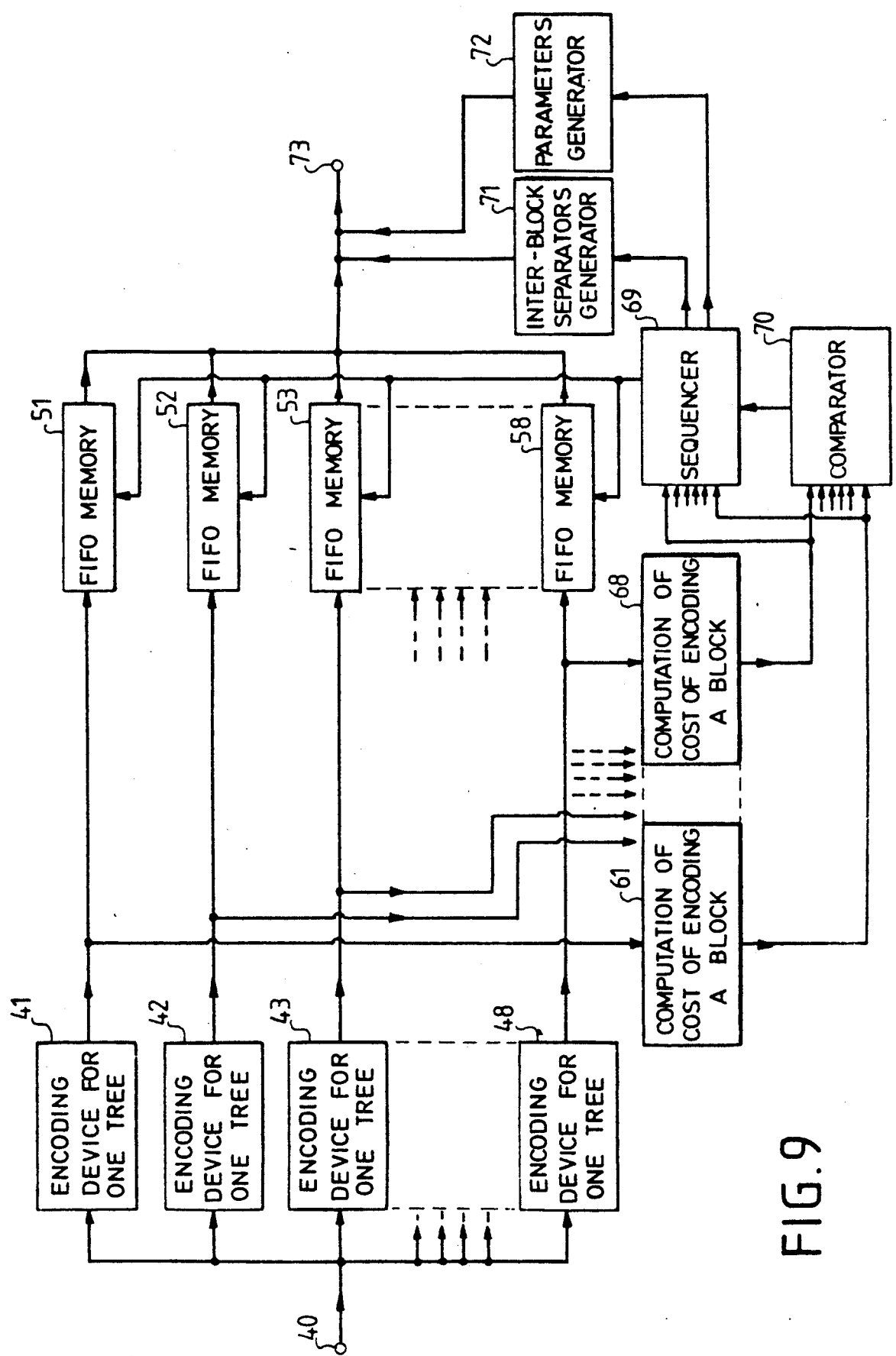
FIG. 9 shows the block diagram of a second embodiment of the encoding device according to the invention, for several encoding trees.

FIG. 9 shows the block diagram of an embodiment of an encoding device according to the invention enabling the encoding to be made of events according to eight separate trees, and finally selecting the encoding tree providing a minimum encoding cost. This example comprises: eight encoders, 41 to 48, identical to the encoding device 1 previously described and shown in FIG. 8, each of these encoders performing an encoding corresponding to a different tree; eight FIFO memories, 51 to 58; eight devices for computing the encoding cost of a block, 61 to 68; a sequencer 69; a comparator 70; an inter-block separator generator 71; a parameters generator 72; and an output connection 73. Each FIFO memory 51 to 58 has a capacity corresponding to the code words of a block of 16×16 values.

The inputs of the encoders 41 to 48 are all connected to the input connection 40 receiving a series of positive integer values which must be encoded. The outputs of the encoders 41 to 48 are respectively connected to data inputs of the FIFO memories 51 to 58 and to inputs of the devices 61 to 68 for computing the encoding cost of a block. These devices 61 to 68 have outputs respectively connected to inputs of the comparator 70 and of the sequencer 69. The sequencer 69 has outputs connected to control inputs of the memories 51 to 58 in order to control the writing and the reading in these memories. An output of the comparator 70 is connected to an input of the sequencer 69. Two outputs of the sequencer 69 are respectively connected to control inputs of the generator 71 and of the generator 72. Outputs of the memories 51 to 58 and of the generators 71 and 72 are connected in parallel to the output connection 73.

The values to be encoded are processed in blocks of 16×16 values, one encoding tree being selected from among eight, using the minimum encoding cost criterion. The encoders 41 to 48 determine, in parallel, a code word for each event; these code words are written in parallel in the FIFO memories 51 to 58, under the control of the sequencer 69; and the computing devices 61 to 68 determine, in parallel, the encoding cost of a block. At the end of the computation of the cost of encoding a block, the comparator 70 supplies to the sequencer 69 a binary word indicating the encoder that has supplied a minimum encoding cost.

The sequencer 69 controls the generator 71 such that it transmits an inter-block separator which is a binary word which cannot be imitated by any licit concatenation of code words supplied by one of the eight trees. Then the sequencer 69 controls the generator 72 such that it transmits in clear the value of the parameters a, b, c corresponding to the encoding tree that provided the minimum encoding cost. Finally, the sequencer 69 controls the reading of the code words corresponding to the complete block of values to be encoded in a single memory 51 to 58 corresponding to the minimum encoding cost.

Figure 10:
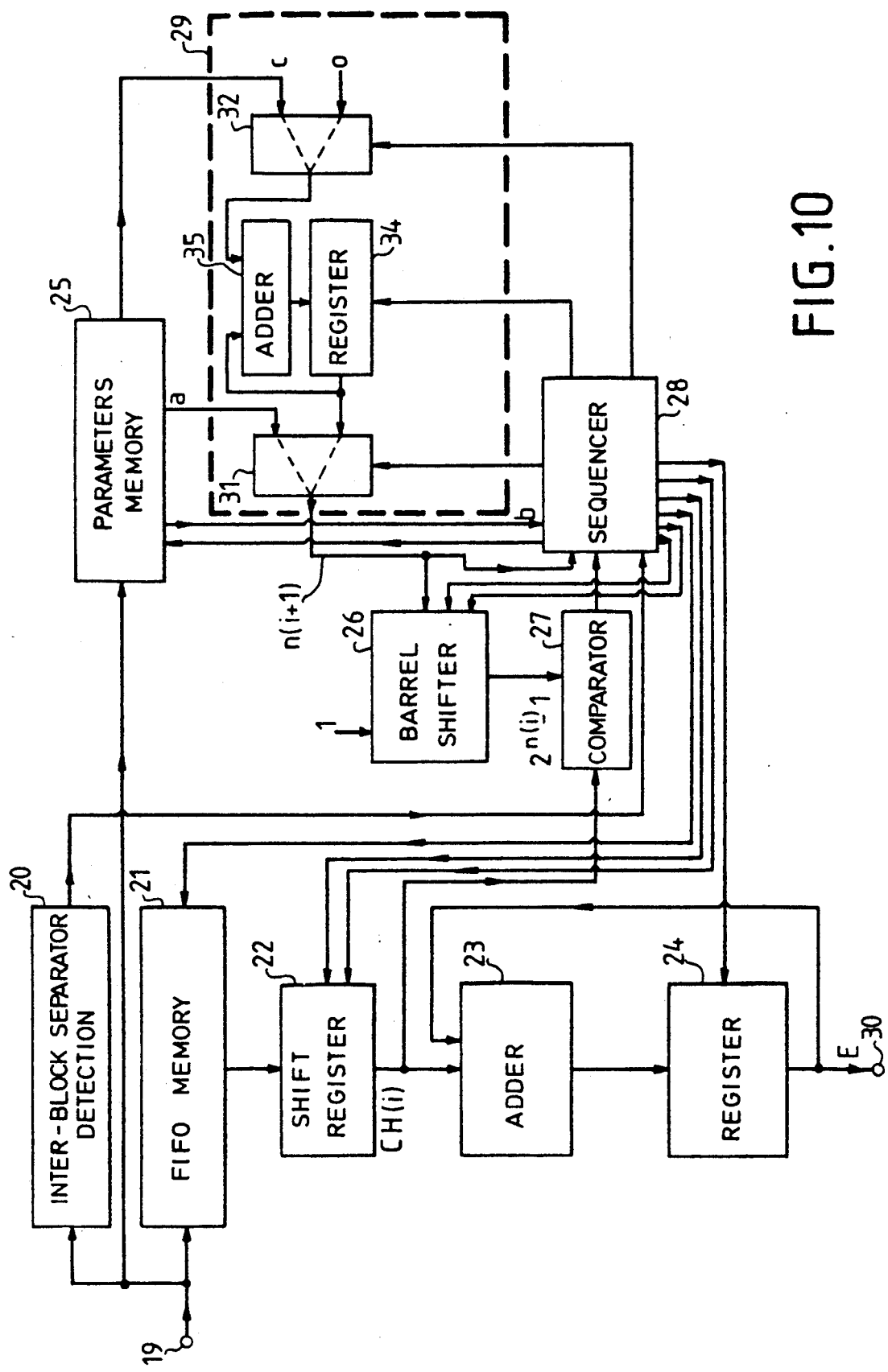
FIG. 10 shows the block diagram of a first embodiment of the decoding device according to the invention, for one or more encoding trees.

FIG. 10 shows the block diagram of a decoding device according to the invention for decoding a series of code words supplied by an encoding device such as that shown in FIG. 9, i.e. code words corresponding to an encoding tree chosen from among eight trees. This embodiment comprises: an input connection 19; a device 20 for detecting inter-block separators; a FIFO memory 21, having a capacity corresponding to a block of 16×16 values to be decoded, a shift register 22, an adder 23, a register 24; a parameters memory 25; a barrel shifter 26; a comparator 27; a sequencer 28; means of computation 29; and an output connection 30.

The input connection 19 is connected to an input of the device 20 and to a serial input of the FIFO memory 21 and to an input of the memory 25. An output of the device 20 is connected to an input of the sequencer 28. An output of the memory 21 is connected to a serial input of the register 22. An output of the register 22 is connected to a first input of the adder 23. A second input of the adder 23 is connected to an output of the register 24. An output of the adder 23 is connected to a data input of the register 24. The output connection 30 of the decoding device is connected to the output of the register 24.

A first input of the comparator 27 is connected to an output of the shifter 26. A second input of the comparator 27 is connected to the output of the register 22. The output of the comparator 27 is connected to an input of the sequencer 28. The register 22 comprises a zero reset input and a clock input respectively connected to two outputs of the sequencer 29. The memory 21 and the register 24 each comprise a control input respectively connected to outputs of the sequencer 28. The parameters memory, 25, comprises an address input connected to an output of the sequencer 28, and three outputs connected respectively to a first input and a second input of the means of computation 29 in order to supply them with the values a and b respectively, and to an input of the sequencer 28 in order to supply it with a value b. The shifter 26 comprises: a data input receiving a continuous 1 value, a zero reset input and a clock input respectively connected to two outputs of the sequencer 28; and a control input connected to an output of the means of computation 29. This output is also connected to an input of the sequencer 28.

The means of computation 29 comprise: two multiplexers, 31 and 32, each having two inputs and one output; an adder 33; and a register 34. A first input of the multiplexer 31 is connected to the first input of the means 29. A second input of the multiplexer 31 is connected to the output of the register 34, this output also being connected to a first input of the adder 33. A second input of the adder 33 is connected to the output of the multiplexer 32. The output of the adder 33 is connected to the data input of the register 34. The output of the multiplexer 31 constitutes the output of the means 29. A first input of the multiplexer 32 continuously receives the zero value and a second input is connected to the second input of the means 29. The multiplexers 31 and 32, and the register 34 respectively have control inputs respectively connected to three outputs of the sequencer 28.

A series of code words is applied in serial form to the input connection 19. The code words corresponding to a block of values are preceded by an inter-block separator which is recognized by the inter-block separator detection device 20, and are preceded by the value in clear of the parameters a, b and c. The value of the parameters is stored in the memory 25 under the action of a control signal supplied by the sequencer 28. The three outputs of the memory 25 respectively supply: the value of the parameter a and the value of the parameter c to the first and to the second input of the means of computation 29; and supply the value of the parameter b to an input of the sequencer 28, in order to enable the computation of the series of values n(i) according to the arithmetic law defined by the value of these parameters. The sequencer 28 comprises an internal counter for counting the integer values i starting from 1 and for controlling the computation of the series of values n(i) in the means of computation 29. The latter function like the means of computation 16 in FIG. 8.

At the time in question, the output of the means 29 supplies the value n(i) to a control input of the barrel shifter 26; and the sequencer 28 supplies control signals to the shifter 26 in order that it may supply a binary word having a value equal to $2^{n(i)}-1$. This value is applied to a first input of the comparator 27. The FIFO memory 21 has a write control input, which is not shown, connected to a conventional device for recovering the frequency of the encoded data transmission channel. This device controls the storage of the encoded data in the memory 21. It also has a read control input, connected to an output of the sequencer 28. Each time that a value n(i) is computed, the sequencer 28 commands the memory 21 to read n(i) bits of the code words stored in the memory 21. These n(i) bits are successively stored in the register 22. For this purpose the sequencer 28 commands a zero reset of the register 22 and then the writing of the n(i) bits applied successively to the serial input of the register 22.

At the time in question, the output of the register 22 supplies a 16-bit word, of which the n(i) least significant bits are encoded data bits and of which the (16−n(i)) most significant bits have a zero value. The value of this binary word is denoted CH(i). It is applied to a first input of the adder 23 and to a second input of the comparator 27.

The comparator 27 compares the value of the binary word CH(i) with the value $2^{n(i)}-1$. The sequencer 28 increments i and computes new values n(i) increasing until, for a value $i_o$ of i, the value $CH(i_o)$ is strictly less than $2^{n(i_o)}-1$. This is detected by the comparator 27 when i assumes the value $i_o$. The sequencer 28 then stops incrementing i. The adder 23 and the register 24 accumulate the values CH(i) for i varying from 1 to $i_o$, the register 24 being controlled by a clock signal which is supplied to it by the sequencer 28 for each new value of i. The output of the register 24 therefore supplies a value which is equal to the sum of $CH(i) = 2^{n(i)} - 1$ for $i=1$ to $i_o-1$, plus the value $CH(i_o)$ of the last field corresponding to $i_o$. the register 24 therefore supplies a decoded value E. This value E is supplied to the output connection 30 of the decoding device.

It is within the capabilities of one skilled in the art to adapt the encoding device and the decoding device for using two separate encoding trees or two separate groups of encoding trees in order to encode positive values on the one hand and negative values on the other hand, according to the method previously described.

The invention is advantageous for the encoding of any type of event which can be easily represented by a series of consecutive integer values, positive or zero, whose probabilities decrease as the values increase. This is the case, in particular, of the values of a variable whose probability decreases monotonically on either side of its mean value. This representation is considered to be easy when it does not require a code conversion read only memory.

The invention is particularly applicable to the encoding of the coefficients obtained by a cosine transformation applied to blocks of values representing blocks of video picture elements. The statistical distribution of the values of transformation coefficients varies from one block of picture elements to another; it is therefore advantageous to adapt the encoding by using an encoding tree which is possibly different for each block of picture elements. The variable length encoding of the transformation coefficients is therefore optimized for each block while a conventional Huffmann encoding is optimized once and for all on the basis of the statistical distribution of the values of coefficients corresponding to a certain number of pictures considered as typical.

The embodiment of an adaptive encoding device and of an adaptive decoding device for the implementation of the method according to the invention is particularly simple and inexpensive, which enables an adaptive encoding to be carried out which would be too costly to carry out using read only memories storing several optimized Huffmann encoding trees.

We claim:

1. Variable length encoding method for encoding a series of consecutive, positive or zero, integer values whose probability of occurrence decreases as a function of each value, characterized in that, in order to encode each value E, the method consists in:

determining a first binary word including only bits having a same value, and whose number of bits B is an increasing function of the value to be encoded E, computing the number of bits B according to a predetermined function B(E);

determining a second binary word having a value corresponding to a rank of the value to be encoded E, in a set of values to be encoded arranged in order of decreasing probability, and whose number of bits B' is derived from the function B(E) and from the number of bits B in the first binary word; constituting a code word by combining the first and second binary words thus determined.

2. Method according to claim 1, characterized in that the number of bits B of the first binary word of the code word comprises a number is equal to a sum of n(i) for $i=1$ to $i_o-1$, where n(i) is an integer number which is a function of a variable integer i according to a determined arithmetic and logic law, and $i_o$ is an integer number which is a function of the value to be encoded E and such that the value to be encoded E is strictly greater than a sum of $(2^{n(i)}-1)$ for $i=1$ to $i_o-1$, and less than or equal to the sum of $(2^{n(i)}-1)$ for $i=1$ to $i_o$; and in that the second binary word has a value equal to the difference between the value to be encoded E and the sum of $(2^{n(i)}-1)$ for $i=1$ to $i_o$; and the number of bits B' of the second binary word is equal to $n(i_o)$.

3. Encoding method according to claim 2, characterized in that the arithmetic and logic law is such that $n(1)=a$ and $n(i)=n(i-1)$ if $i-1$ is within a range between 1(modulo b) and $b-1$(modulo b) inclusive; and $n(i)=n(i-1)+c$ if $i-1 \equiv 0$(modulo b); a, b and c being fixed integer constants.

4. Encoding method according to claim 1 characterized in that the method furthermore consists in:

defining, for a same series of values to be encoded E, several sets of code words, corresponding to different statistical distributions of values to be encoded, each set being defined by a different function B(E) and characterized by a value of a set of parameters of the function B(E);

computing an encoding cost of the series of values to be encoded E, for each set of code words, and determining which set of code words provide a minimum encoding cost;

encoding the values to be encoded E, with the code words of the set of code words which provide the minimum encoding cost and, attaching a word representing the parameters of the function B(E) corresponding to the set of code words which provide the minimum encoding cost.

5. Variable length encoding method according to claim 1, and for encoding a finite series of consecutive relative integer values, whose probability of occurrence decreases as a function of an absolute value of the value to be encoded E, but whose probability of occurrence is the same whatever the sign of the value to be encoded E may be, characterized in that the method further consists in:

representing a series of relative values by a series of consecutive, positive or zero, integer values, each value to be encoded E being represented by a binary word whose most significant bits are constituted by bits representing an absolute value of the value to be encoded E and whose least significant bit is constituted by a sign bit of the value to be encoded E;

encoding the series of consecutive positive or zero integer values.

6. Variable length encoding method according to claim 1, and for encoding a finite series of consecutive relative integer values, whose probability of occurrence decreases as a function of an absolute value of the value to be encoded E and varies as a function of the sign of the value to be encoded E, characterized in that the method further consists in:

representing a series of relative values by two series of positive consecutive integer values and a zero value, respectively corresponding to positive values to be encoded, negative values to be encoded and a zero value, each value to be encoded E being represented by an absolute value;

differently encoding the two series of consecutive integer values with two different functions B(E) in order to respectively minimize encoding costs of the two series;

attaching to each code word thus obtained a two-bit binary word indicating if the encoded value is positive, negative or zero.

7. Decoding method for decoding a series of positive or zero consecutive integer values, characterized in that in order to decode each value, the method consists in:

seeking among the first bits to be decoded a first binary word, containing only bits having a same predetermined value, whose number of bits is a maximum and equal to one value of a series of integer values defined by a function B(E) used for encoding;

determining a second binary word, constituted of bits following the bits of the first binary word, and whose number of bits is derived from the function B(E) used for the encoding, and from the number of bits of the first binary word;

determining a predetermined decoded value, by adding an integer value corresponding to the number of bits of the first binary word predetermined by the function B(E), and the value of the second binary word.

8. Decoding method according to claim 7, characterized in that in order to determine the predetermined integer value corresponding to the number of bits of the first binary word, the method consists, for an integer i increasing from 1, in:

computing a series of integer numbers n(i) according to an arithmetic and logic law identical to an arithmetic and logic law used for encoding;

determining a binary values CH(i) of a binary word constituted of n(i) consecutive bits of a series of bits to be decoded, these n(i) bits being separate for each value of i;

comparing the binary values CH(i) respectively with values $2^{n(i-1)}$;

determining a maximum value $i_o$ of i, such that CH(i$_o$−1) is equal to $2^{n(i_o-1)}$;

adding the binary CH(i), for i increasing from 1 to $i_o$ inclusive, the value of a sum of the binary values CH(i) corresponding to a rank of the value to be decoded in a set of possible decoded values, arranged in order of decreasing probability.

9. Encoding device for encoding a series of consecutive positive or zero integer values, whose probabilities of occurrence decrease according to increasing values, characterized in that the encoding device comprises:

first means of computation (16) for computing a first series of integer values n(i) according to a predetermined law of progression, for integer values i increasing from 1;

second means of computation (5 to 7, 13, 14) for computing a second series of integer values S(i), S(i) being equal to the sum of $(2^{n(u)}-1)$ for integer values u increasing from 1 to i, and for comparing the second series of integer values with a value to be encoded E; and determining a value $i_o$ such that the value to be encoded E is strictly greater than S($i_o$−1) and less than or equal to S($i_o$);

third means of computation (15, 17) for forming a binary word of B($i_o$−1) bits having a predetermined identical value, 1B($i_o$−1) being equal to the sum of n(i) for i=1 to $i_o$−1;

means (3, 4) for constituting a code word comprising a first section constituted by the binary word of B($i_o$−1) bits having a predetermined identical value; and a second section constituted by a binary word whose value is E−S($i_o$−1).

10. Encoding device according to claim 9, characterized in that the first means of computation (16) comprise an arithmetic and logic circuit (9 to 13) for computing the value n(i), for an integer i increasing from 1, according to the formulae:

n(1)=a n(i)=n(i−1) if i−1 is within a range between 1(modulo b) and b−1(modulo b) inclusive;

n(i)=n(i−1)+c if i−1=0(modulo b);

a, b, and c being fixed positive integer constants.

11. Encoding device, characterized in that the encoding device comprises:

a plurality of encoding devices (41 to 48) by encoding each value to be encoded, according to a plurality of sets of code words, each set being defined by a value of a set of parameters;

a plurality of devices (61 to 68) for computing a cost of encoding a block of values to be encoded for each set of code words respectively;

means (70) for determining which set of code words provides a minimum encoding cost for a given block of values to be encoded;

means (51 to 58) for storing the encoded values corresponding to the block of values to be encoded, for each set of code words;

means (69, 71, 72) for re-reading from the means of storing (51 to 58), the encoded values corresponding to the set of code words providing the minimum encoding cost;

means (72) for transmitting the encoded values corresponding to the set of code words providing the minimum encoding cost while adding to the encoded values corresponding to the set of code words providing the minimum encoding cost the value of the set of parameters defining the set of code words providing the minimum encoding cost.

12. Decoding device, characterized in that the decoding device comprises:

means (21) for storing the bits of a series of encoded values;

first means of computation (29) for computing a series of integer values n(i) according to a predetermined arithmetic and logic law identical to an arithmetic and logic law used for encoding, for integer values of i increasing from 1;

second means of computation (22, 26 to 28) for computing a value $2^{n(i)}-1$ for each value n(i) by reading, from the means for storing (21), a field constituted from n(i) consecutive bits of the encoded values, separate for each value of the series of integer values n(i); determining binary values CH(i) of this field; and determining a value $i_o$ of i such that the binary value CH($i_o$) is strictly greater than $2^{n(i_o-1)}-1$ and less than or equal to $2^{n(i_o)}-1$;

third means of computation (23, 24) for adding the binary values CH(i) for i increasing from 1 to $i_o$, the value of a sum of the binary values CH(i) corresponding to a rank of the value to be decoded, in the set of possible decoded values, arranged in order of decreasing probability.

13. Decoding device according to claim 12, characterized in that the first means of computation (29) comprise an arithmetic and logic circuit (31 to 34), for computing the value n(i), for integer i increasing from 1, according to the formulae:

n(1)=a $n(i)=n(i-1)$ if i−1 is within a range between 1(modulo b) and b−1(modulo b) inclusive;

$n(i)=n(i-1)+c$ if $i-1=0$(modulo)(sic); a, b and c being fixed positive integer constants.

14. Decoding device according to claim 12, characterized in that the first means of computation (29) compute the series of integer values n(i) for blocks of the values to be encoded as a function of a value of a set of parameters, which is variable for each block of values to be encoded, the value of the set of parameters being transmitted with the encoded values.

* * * * *

ID OFFICE
UNITED STATES PATENT AND TRADEMARK OFFICE
CERTIFICATE OF CORRECTION

PATENT NO. : 5,021,782
DATED : June 4, 1991
INVENTOR(S) : Claude Perron et al.

It is certified that error appears in the above-identified patent and that said Letters Patent is hereby corrected as shown below:

On the title page:
The PCT No. is incorrect, should be --PCT/FR89/00061--.

Signed and Sealed this

First Day of December, 1992

Attest:

DOUGLAS B. COMER

*Attesting Officer*  *Acting Commissioner of Patents and Trademarks*